(12) United States Patent
Lu et al.

(10) Patent No.: US 7,999,350 B2
(45) Date of Patent: Aug. 16, 2011

(54) ELECTRODE STRUCTURE OF MEMORY CAPACITOR

(75) Inventors: Su-Tsai Lu, Miaoli County (TW); Wen-Hwa Chen, Hsinchu (TW); Hsien-Chie Cheng, Hsinchu (TW); Yun-Chiao Chen, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 176 days.

(21) Appl. No.: 12/205,935

(22) Filed: Sep. 8, 2008

(65) Prior Publication Data

US 2009/0224362 A1 Sep. 10, 2009

(30) Foreign Application Priority Data

Mar. 5, 2008 (TW) ............................... 97107733 A

(51) Int. Cl.
*H01L 21/20* (2006.01)
*H01L 27/06* (2006.01)
(52) U.S. Cl. ................ 257/532; 257/534; 257/E27.016; 257/E27.048; 257/E21.647
(58) Field of Classification Search ................. 257/532, 257/534, E27.016, E27.048
See application file for complete search history.

(56) References Cited

U.S. PATENT DOCUMENTS

| | | | |
|---|---|---|---|
| 5,656,536 A | 8/1997 | Wu | |
| 5,763,286 A | 6/1998 | Figura et al. | |
| 5,766,994 A | 6/1998 | Tseng | |
| 5,843,822 A | 12/1998 | Hsia et al. | |
| 5,851,897 A * | 12/1998 | Wu | 438/397 |
| 6,177,309 B1 | 1/2001 | Lee | |
| 6,265,263 B1 | 7/2001 | Wu | |
| 6,411,492 B1 * | 6/2002 | Kar-Roy et al. | 361/305 |
| 7,027,287 B2 * | 4/2006 | Georgakos | 361/303 |
| 7,109,081 B2 * | 9/2006 | Lee | 438/255 |
| 7,119,392 B2 | 10/2006 | Kim et al. | |
| 7,339,225 B2 * | 3/2008 | Chien et al. | 257/303 |
| 2006/0086961 A1 | 4/2006 | Iijima et al. | |
| 2006/0273369 A1 * | 12/2006 | Lee | 257/301 |

OTHER PUBLICATIONS

"1st Office Action of China counterpart application", issued on Jan. 22, 2010, p. 1-p. 4.

* cited by examiner

*Primary Examiner* — Ken A Parker
*Assistant Examiner* — David Spalla
(74) *Attorney, Agent, or Firm* — Jianq Chyun IP Office

(57) ABSTRACT

After a fabrication process intended to miniaturize semiconductor devices, a surface area of a stack capacitor in a random access memory (RAM) is significantly reduced and capacity thereof is thus decreased, which in turn causes the capacitor not able to function properly. The present invention provides a composite lower electrode structure consisting of an exterior annular pipe and a central pillar having concave-convex surfaces to increase a surface area of the capacitor within a limited memory cell so as to enhance the capacity. To reinforce intensity of a structure of the capacitor, the exterior annular pipe has an elliptic radial cross section and a thicker thickness along a short axis direction.

10 Claims, 8 Drawing Sheets

ELECTRODE STRUCTURE OF MEMORY CAPACITOR

CROSS-REFERENCE TO RELATED APPLICATION

This application claims the priority benefit of Taiwan application serial no. 97107733, filed on Mar. 5, 2008. The entirety of the above-mentioned patent application is hereby incorporated by reference herein and made a part of specification.

BACKGROUND OF THE INVENTION

1. Field of the Invention

The present invention is related to a semiconductor device and a manufacturing method thereof, and particularly to an electrode structure of a memory capacitor and a method of manufacturing the same.

2. Description of Related Art

As technology advances, application of semiconductor devices is growing more and more extensive. For example, semiconductor memory devices such as dynamic random access memory (DRAM) devices or static random access memory (SRAM) devices generally include capacitors and transistors to store and read data or information. Given that the memory capacity required by computers increases rapidly, the number of capacitors required and the required capacity of each capacitor also increases as well. Therefore, the semiconductor manufacturing technology needs to change its process technology to satisfy such demands.

Meanwhile, to further enhance the integration level in the DRAM, the manufacturing process thereof continues miniaturizing and a capacitor cross section area per unit and space among capacitors keep growing smaller and smaller. Within such limited space, capacitors need to provide sufficient capacity to maintain signal intensity. Hence, in DRAM designs, the interrelation between the design and layout of a capacitor structure and capacity thereof is emphasized and the manufacturing process of DRAMs is simplified to enhance yield and reduce fabrication costs for DRAM manufacturers.

DRAMs use capacitors as a device for storing signals. The more charges a capacitor stores, the less reading data is affected by noise, and the frequency of refreshing may thus be further reduced. Methods of increasing capacity of the capacitor include: (1) increasing the dielectric constant of the dielectric layer to increase the number of charges stored by each unit area of the capacitor; (2) reducing the thickness of the dielectric layer although the quality level of the dielectric material itself would limit the thickness of the dielectric layer only to a certain minimum value; (3) increasing the area of the capacitor so that the number of charges stored in the capacitor increases although the integration level in the DRAM would thus be reduced.

When the storage capacity of the conventional DRAM is smaller, in the integrated circuit process, two-dimensional capacitors are mainly used for implementation, i.e. the so-called planar type capacitors. The planar type capacitor needs to occupy a considerable area of a semiconductor substrate to store charges and therefore is not suitable to be applied in high integration levels. DRAMs with high integration levels need to use three-dimensional capacitors for implementation, such as the so-called stack type capacitor or trench type capacitor. When integration of memory devices reaches higher levels, a simple three-dimensional capacitor structure is not sufficient for its purposes. Consequently, a solution of increasing the surface area of the DRAM within a small area is thus developed.

Furthermore, in order to effectively increase capacity, the cylindrical capacitor having a larger total surface area on an interior and an exterior side is chosen over the conventional cup capacitor which is more stable although twin bit failure may occur if intensity of the capacitor structure weakens. For example, during the 90 nm fabrication process, twin bit failure may occur because the capacitor structure is unstable. Accordingly, solutions point in two directions. On the one aspect, space in the capacitor structure is designed as such to actively avoid contact between capacitors. On the other aspect, support structures are added among capacitors during steps in the fabrication process to passively prevent the twin bit failure from occurring.

Several US patents or published patent applications disclose techniques which increase the capacitor surface area by different exterior designs. In U.S. Pat. No. 5,656,536, a coronary electrode extending inwards is used to increase the capacitor surface area. In U.S. Pat. No. 5,763,286, a lower electrode plate having an interior surface and an exterior surface as an annular trench is used to increase the capacitor surface area. Moreover, in U.S. Pat. No. 6,177,309, a cylinder having a dual annular section is used as a lower electrode plate to increase the capacitor surface area. In U.S. Pat. No. 7,119,392, a heavily doped amorphous silicon and a lightly doped amorphous silicon are used to enhance the intensity of the structure and a hemispherical grain (HSG) is used as a storage node to increase the capacitor surface area.

SUMMARY OF THE INVENTION

The present invention is directed to an electrode structure of a memory capacitor. A lower electrode of the electrode structure is a composite electrode structure consisting of an exterior annular pipe and a central pillar. An internal surface and an external surface of the electrode structure are undulated or square-waved so as to increase a capacitor surface area.

The present invention is directed to an electrode structure of a memory capacitor. An exterior annular pipe of the electrode structure has an elliptic radial cross section and a thicker thickness along a short axis direction of the elliptic radial cross section so that an intensity of the capacitor structure is enhanced to avoid twin bit failure caused by an unstable structure.

The present invention provides an electrode structure of a memory capacitor. The electrode structure includes a lower electrode, a dielectric layer and an upper electrode. The lower electrode consists of an exterior annular pipe and a central pillar. The exterior annular pipe has an elliptic radial cross section. The dielectric layer covers the lower electrode and the upper electrode covers the dielectric layer.

The present invention provides an electrode structure of a memory capacitor. The electrode structure includes a lower electrode, a dielectric layer and an upper electrode. The lower electrode includes a plurality of first electrode materials and second electrode materials alternately stacked on top of each other. An internal surface and an external surface of the lower electrode are concave-convex. The dielectric layer covers the lower electrode and the upper electrode covers the dielectric layer.

The present invention provides a method of manufacturing a memory capacitor structure. The method includes following steps. First, a plurality of first electrode materials and second electrode materials alternately stacked on top of each other is sequentially formed on a substrate. Then, the first electrode materials and the second electrode materials are deeply etched to form a lower electrode. Next, a selective lateral etching process is performed on an internal surface and an external surface of the lower electrode. A dielectric layer covers the lower electrode. Afterwards, an upper electrode covers the dielectric layer.

Since the memory capacitor structure having an annular pipe on the exterior and a pillar in the center is used in the present invention, the capacitor surface area of the lower electrode is effectively increased and thereby increasing the capacity. Furthermore, the elliptic cross section is designed to reinforce the intensity of the memory capacitor structure and reduces capacitance shift so as to avoid twin bit failure when the memory capacitor structure is loaded with exterior forces during the manufacturing process. Even when the central pillar tips over because of its weaker structure, since the central pillar and the exterior annular pipe both belong to the lower electrode, the capacitor does not fail to function. In addition, the manufacturing method of the memory capacitor structure in the present invention does not require a mold material. As a result, when faced the condition that the future fabrication process will continue miniaturizing, the manufacturing method can still manufacture memory capacitor structures with high density by simple steps.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings show embodiments of the invention and, together with the description, serve to explain the principles of the invention.

DESCRIPTION OF EMBODIMENTS

Figure 1:
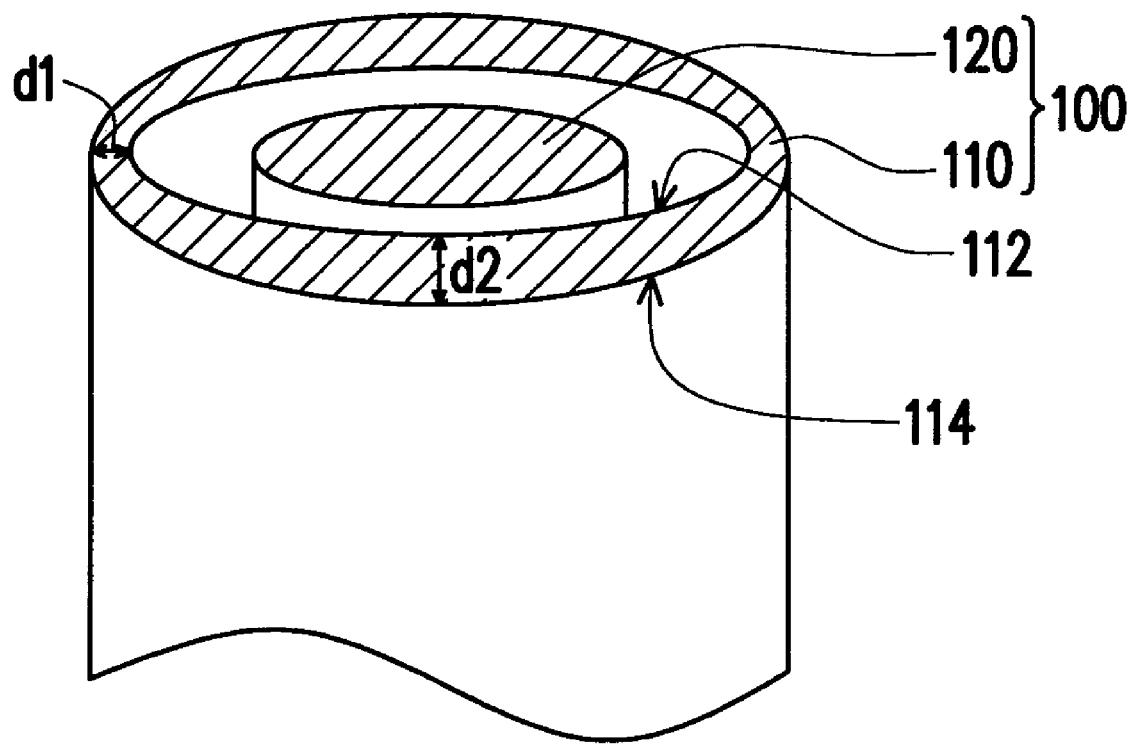
FIG. 1 is a schematic three-dimensional view showing an electrode structure of a memory capacitor according to an embodiment of the present invention.

FIG. 1 is a schematic three-dimensional view showing an electrode structure of a memory capacitor according to an embodiment of the present invention.

Figure 2A:
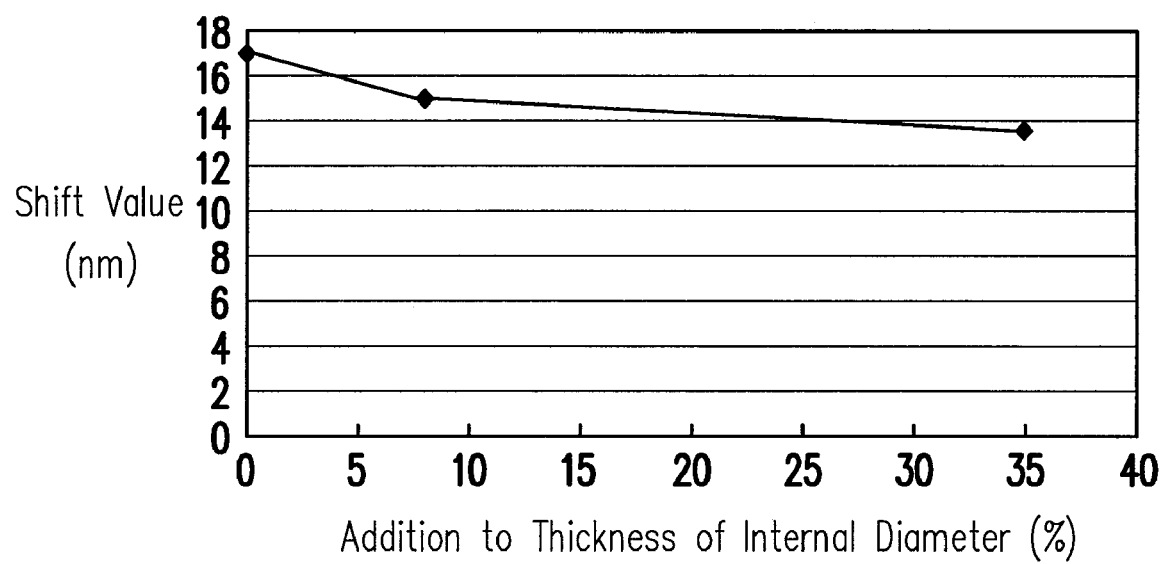
FIGS. 2A and 2B are graphs showing variation in a shift value of a capacitor structure in respect of a thickness of a lower electrode.
Figure 2B:
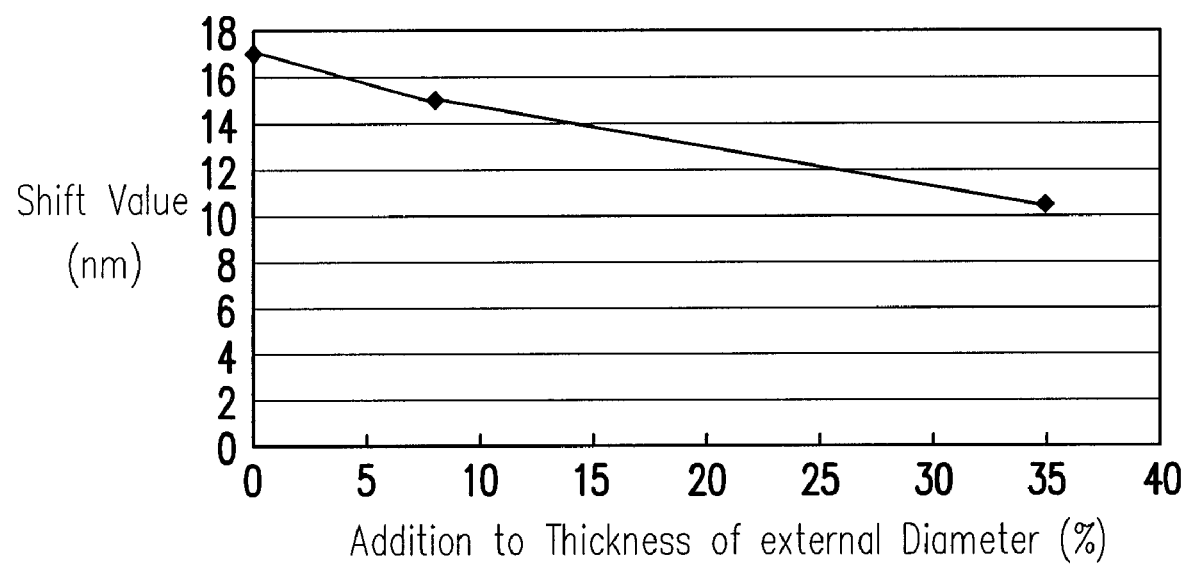

FIGS. 2A and 2B are graphs showing variation in intensity of a capacitor structure in respect of a thickness of a lower electrode.

Referring to FIG. 1, a lower electrode 100 of a memory capacitor is a composite electrode structure consisting of an exterior annular pipe 110 and a central pillar 120. The exterior annular pipe 110 has an elliptic radial cross section, and the elliptic radial cross section has a thickness d1 along a long axis direction and a thickness d2 along a short axis direction.

To enhance the intensity of the composite electrode structure, the exterior annular pipe 110 is designed to have an elliptic cross section, which reduces possibility of a capacitor's shift more effectively than the conventional column capacitor which has a weaker structure. Additionally, during fabrication of the lower electrode 100 of the memory capacitor, as a height of the lower electrode 100 increases, the structure is enhanced in the short axis direction so as to enable the lower electrode 100 to withstand a lateral force applied to a top of the lower electrode 100. A common method of reinforcing the structure is adding a reinforcement structure around the lower electrode 100 to enhance intensity of the capacitor structure. In the present embodiment, the intensity of the capacitor structure is reinforced by increasing the thickness d2 along the short axis direction, and the thickness d2 is larger than the thickness d1 along the long axis direction without requiring protection from the reinforcement structure.

Referring to the graphs of FIGS. 2A and 2B, in which structure rigidity of the lower electrode 100 is analyzed with the ANSYS® finite element set software. A lateral force is applied to the top of the lower electrode 100 so as to observe how the capacitor structure is affected by variation in the thickness of the lower electrode 100. In FIG. 1, variation in thicknesses of an internal diameter 112 and an external diameter 114 of the exterior annular pipe 110 are shown in FIGS. 2A and 2B. The graph of FIG. 2A shows how a shift value decreases when the internal diameter thickens inwards (by 8% to 35%), while the graph of FIG. 2B shows how a shift value decreases when the external diameter thickens outwards (by 8% to 35%).

It is learned from analysis results that the shift values of the thickened lower electrode 100 significantly decrease compared to a lower electrode having a uniform thickness. When the external diameter thickens outwards by 35%, the lateral shift is lowered to the largest degree, by about 37%. Therefore, in the present embodiment, the elliptic cross section is designed to have its external diameter along the short axis direction (the thickness d2) thickened outwards, as shown in FIG. 1.

Figure 3A:
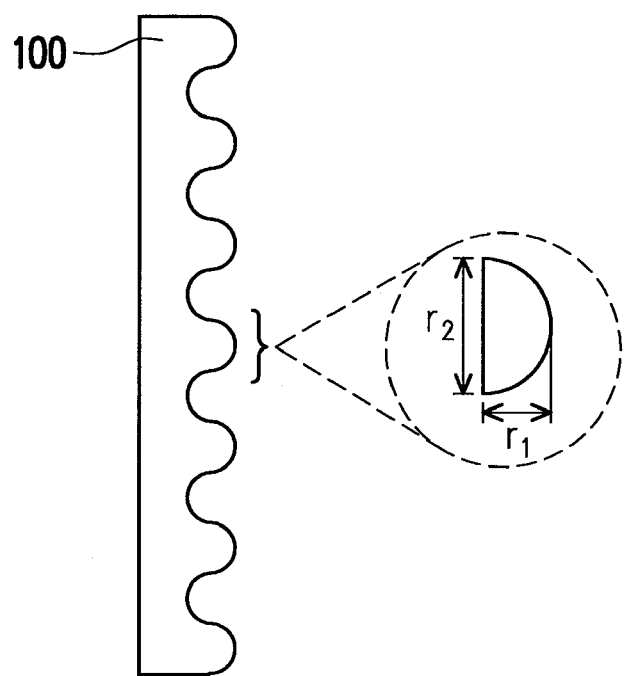
FIGS. 3A and 3B are schematic vertical cross-sectional views showing any side of a lower electrode.
Figure 4:
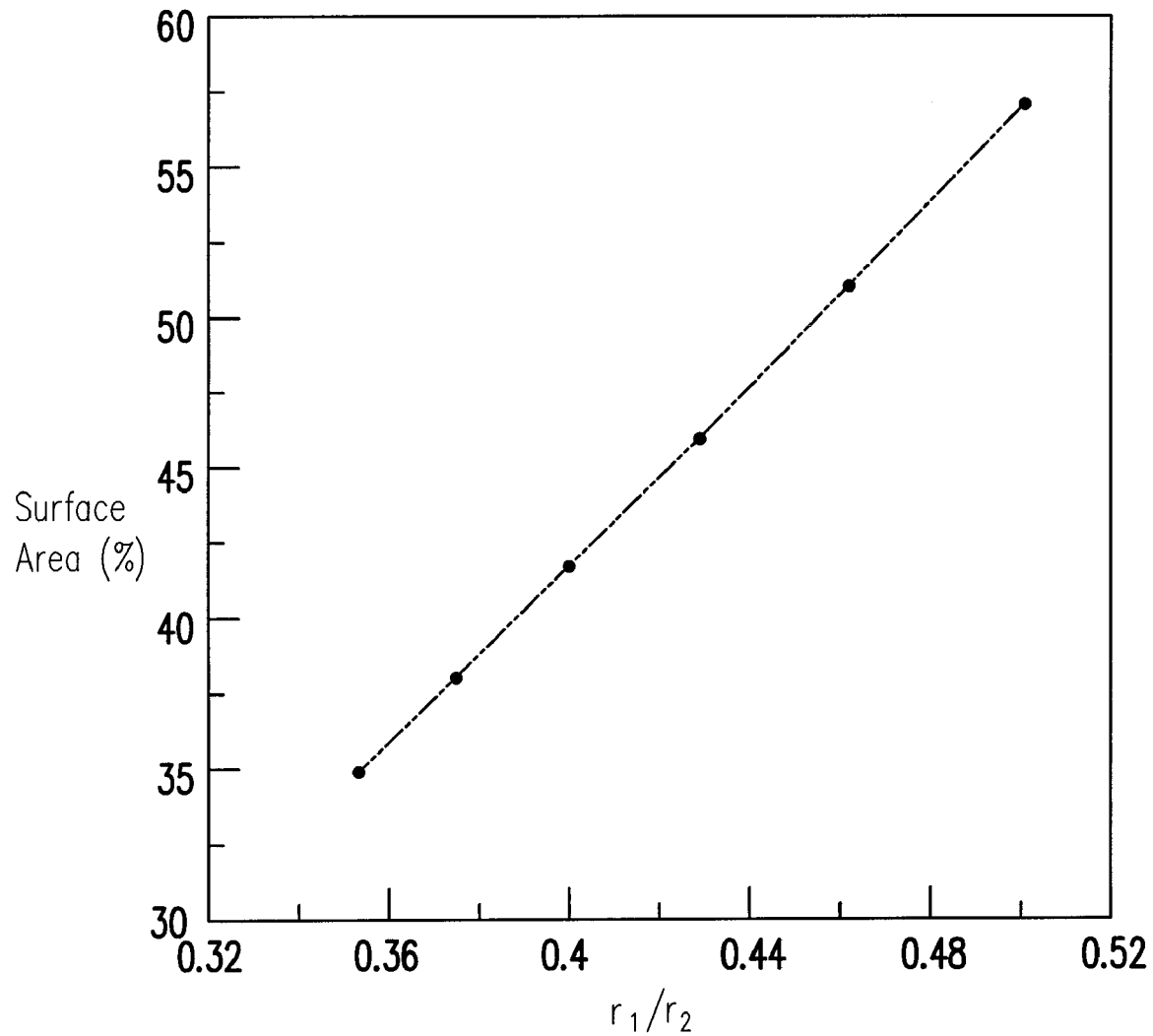
FIG. 4 is a schematic view showing results of a ratio of r1 to r2 versus a surface area gain effect.

The central pillar 120 may be a column or an elliptic pillar and an external surface of the central pillar 120 may be concave-convex, such as undulated or square-waved so as to increase a capacitor surface area. Furthermore, an internal surface and an external surface of the exterior annular pipe 110 may both be formed as concave-convex, such as undulated or square-waved, so as to increase the capacitor surface areas. To understand an capacity gain effect of the lower electrode 100, a vertical cross section of any side of the lower electrode 100 is taken for example in the following to calculate a range of addition in the surface area of the undulated surface of the exterior annular pipe 110. As shown in FIG. 3A, the undulated surface of the lower electrode 100 consists of alternately aligned concave and convex surfaces and a height r1 of an arc and a bottom length r2 of the concave and convex surfaces determine a gain value of the undulated surface. As results shown in FIG. 4, the larger a ratio of r1 to r2 is, the greater an effect of the surface area gain can be attained.

Figure 3B:
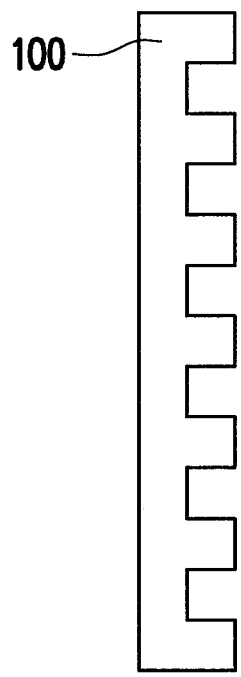

Next, as shown in the vertical cross-sectional view of FIG. 3B, in another embodiment the present invention, a side surface of the lower electrode 100 may be square-waved, which can also increase the capacitor surface area so as to expand the capacity.

The central pillar 120 is located inside the exterior annular pipe 110 and protected by the exterior annular pipe 110, whose structure has higher intensity. Hence, the central pillar does not require other reinforcement structures. Materials of the central pillar 120 and the exterior annular pipe 110 are both electrode materials such as polysilicon, doped polysilicon or titanium/titanium nitride or copper. The central pillar 120 and the exterior annular pipe 110 may be formed by deeply etching electrode materials exposed under a mask pattern so as to produce the lower electrode structure with a predetermined depth. A bottom of the lower electrode 100 is formed with a base electrode, and the exterior annular pipe 110 and the central pillar 120 are electrically connected with each other through the base electrode. Accordingly, even if the central pillar 120 having a weaker structure shifts or tips over, it is alright and the capacitor would not fail to function because the central pillar 120 and the exterior annular pipe 110 both belong to the lower electrode 100.

In order to describe fabrication of the lower electrode 100 having an undulated surface, the manufacturing method of the memory capacitor structure in the present invention is shown and exemplified by an embodiment thereof in the following.

Figure 5A:
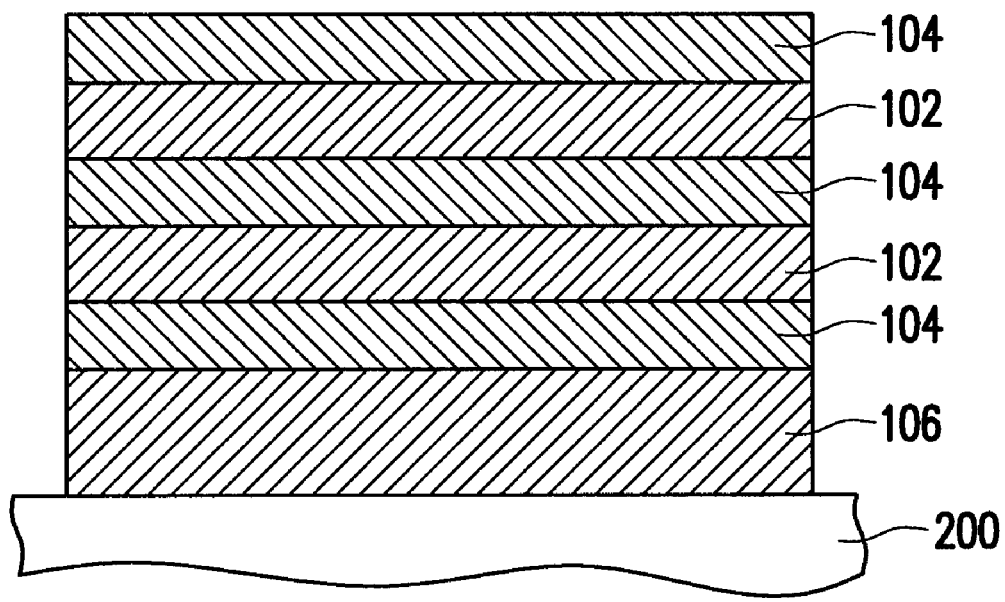
FIGS. 5A through 5E is a schematic flowchart showing a manufacturing method of a memory capacitor structure according to an embodiment of the present invention.
Figure 5B:
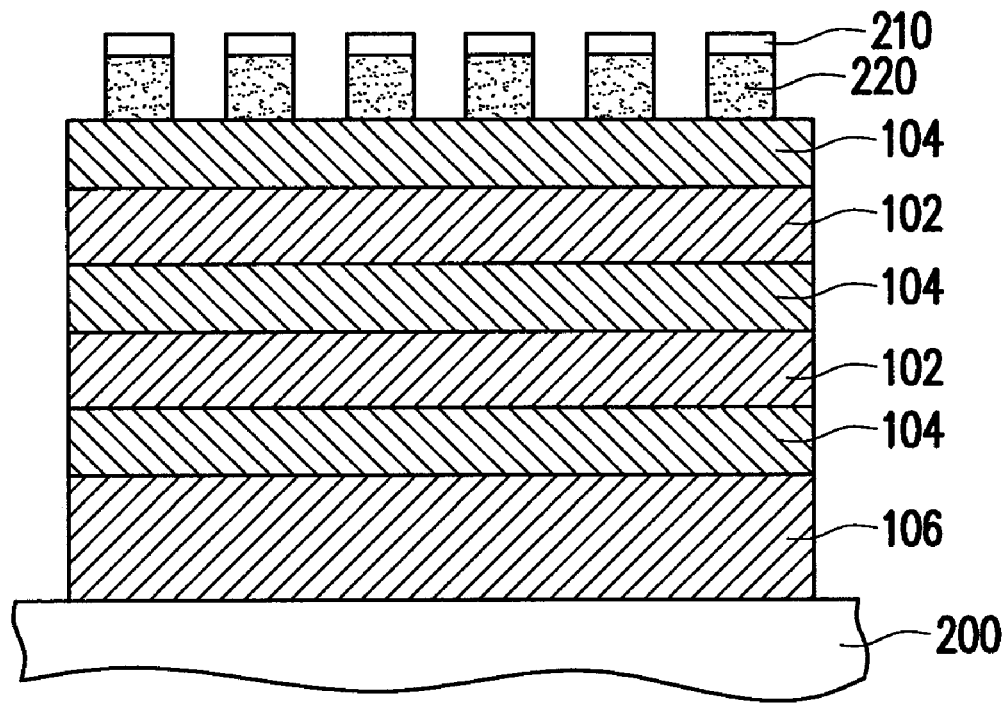
Figure 5C:
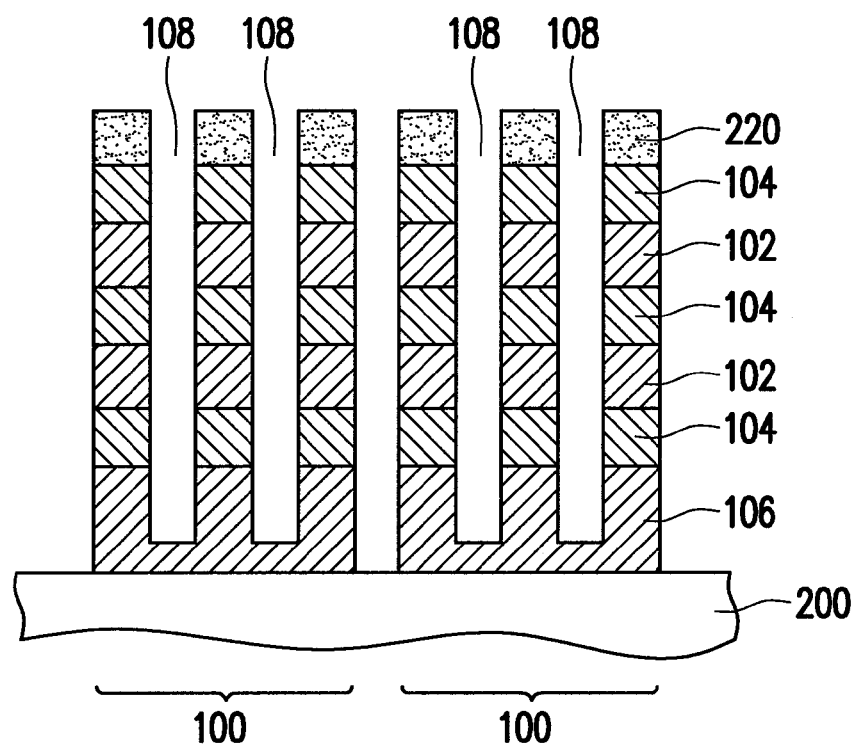
Figure 5D:
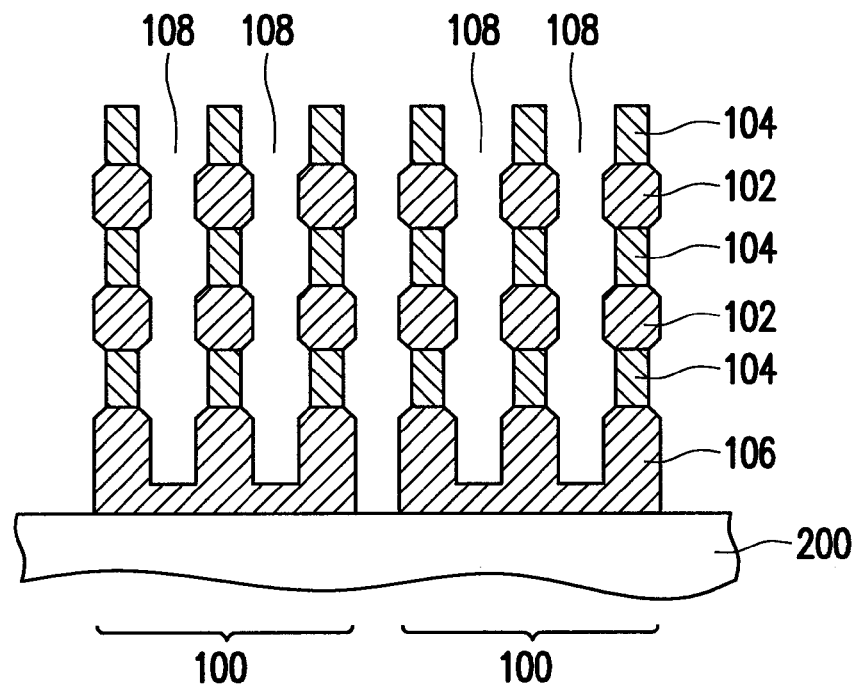
Figure 6:
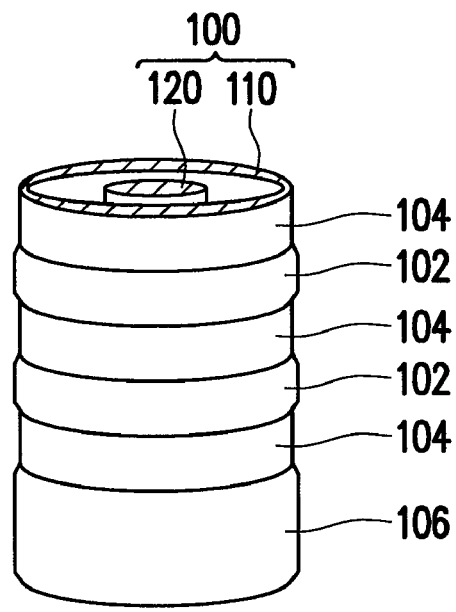
FIG. 6 is a schematic three-dimensional view of the lower electrode of FIG. 5D.

Referring to a schematic flowchart of FIGS. 5A through 5C, a plurality of layers of electrode material is deposited on a substrate 200 by a chemical vapor deposition (CVD) process, for example, to sequentially form a first electrode material 102 and a second electrode material 104 having different etching rates on the substrate 200. Thus, the first electrode material 102 and the second electrode material 104 are deposited and alternately stacked on top of each other until the lower electrode 100 reaches a predetermined height. Afterwards, a mask pattern (a photo-resist layer 210 and a hard mask layer 220) is formed to perform a deep etching process on the first electrode material 102 and the second electrode material 104 until a base electrode 106 is exposed in an annular trench 108 so as to form a plurality of lower electrodes 100. FIG. 5C is a cross-sectional view of the lower electrode 100 of FIG. 1. The lower electrode 100 has an exterior annular pipe 110 with an elliptic radial cross section and a central pillar 120. The exterior annular pipe 110 has a thickness dl along a long axis direction, and a thickness d2 along a short axis direction, d2>d1. Next, referring to FIG. 5D, after the mask pattern is removed, a selective lateral etching process is performed on an internal and an external surfaces of the lower electrode 100, such as using an etchant with a high selection ratio to perform a lateral etching process on the internal and external surfaces of the exterior annular pipe 110 and an external surface of the central pillar 120. Since the first electrode material 102 and the second electrode material 104 have high selection etching ratios and different etching rates, the lower electrode 100 having an undulated surface is thus produced. Referring to both the cross-sectional view of FIG. 5D and the schematic three-dimensional view of FIG. 6, the exterior annular pipe 110 and the central pillar 120 of the lower electrode 100 are laterally etched to form concave-convex surfaces so as to increase a capacitor surface area of the lower electrode 100.

Figure 5E:
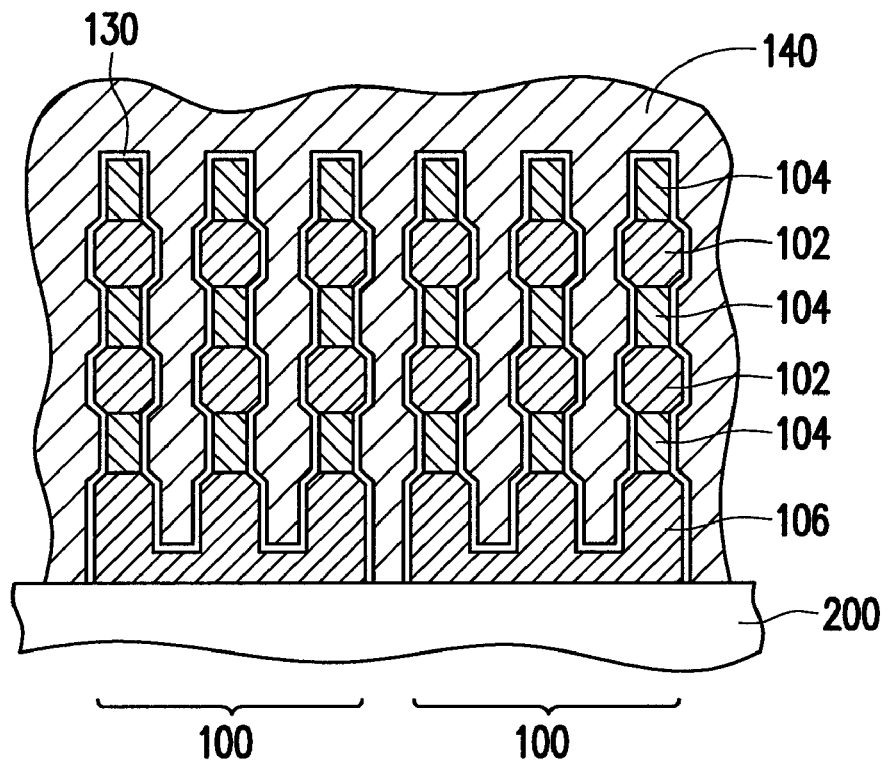

Finally, as shown in FIG. 5E, after cleaning, a dielectric layer 130 is formed by a CVD process to cover the lower electrode 100, and an upper electrode 140 is formed by a CVD process to cover the dielectric layer 130. Thus, a memory having a high-density capacitor structure like a DRAM is manufactured.

Materials of the upper electrode 140 and the lower electrode 100 may be the same, such as polysilicon, doped polysilicon or conductive materials containing metal like titanium, titanium nitride, copper or wolfram. The dielectric layer 130 is formed approximately along profiles of the internal and external surfaces of the lower electrode 100. Besides covering the dielectric layer 130, the upper electrode 140 entirely fills up the annular trench 108 between the exterior annular pipe 110 and the central pillar 120 and isolation spaces between two adjacent lower electrodes 100.

In the present embodiment, the second electrode material 104 has the highest etching rate, the first electrode 102 has the second highest etching rate and the base electrode 106 has the lowest etching rate, but the present invention is not limited to this design. A wave peak of the undulated surface of the lower electrode 100 may be formed by the first electrode material 102 and a wave bottom of the undulated surface may be formed between two wave peaks by the second electrode material 104 so as to form a quasi-sine-waved or any other types of undulated surfaces. However, the greater a difference between the selection etching ratios of the first and second electrode materials, the larger the ratio of r1 to r2 would be, and the more surface area gain effect would be attained. A number of layers, thicknesses and a total height of the first electrode material 102 and the second electrode material 104 may be designed according to the structure intensity of the lower electrode 100. Certainly, within a specific height limit, as the number of layers increases, the surface area gain effect would also be more significant.

In the prior art, the mold materials having different etching ratios (such as BPSG and silicon oxide of TEOS) are used to etch a mold trench having a concave-convex surface, then an electrode material is deposited in the mold trench and afterwards an HSG layer is coated to increase capacity. In comparison, in the present invention, the first and second electrode materials having different etching ratios are used in the manufacturing method and the ratio of r1 to r2 is adjusted to increase the capacity so that the mold material and the HSG layer are not required. As a result, time and manufacturing costs spent on the process are effectively reduced by simplifying the fabrication.

In summary, the memory capacitor structure having the annular pipe on the exterior and the pillar in the center is provided in the present invention to effectively increase the capacitor surface area of the lower electrode and thereby increasing the capacity thereof. Further, the design of the elliptic cross section reinforces the intensity of the memory capacitor structure and reduces capacitance shift when the memory capacitor structure is loaded with external forces during fabrication so that twin bin failure does not occur easily. Even if the central pillar with a weaker structure tips over, it is alright and the capacitor would not fail to function because the central pillar and the exterior annular pipe both belong to the lower electrode.

Additionally, the manufacturing method of the memory capacitor structure of the present invention does not require a mold material. Therefore, when faced with the condition that the fabrication process continues miniaturizing in the future, the manufacturing method of the present invention can still manufacture memory capacitor structures with high density by simple steps.

Although the present invention has been disclosed above by preferred embodiments, they are not intended to limit the present invention. Anybody skilled in the art can make some modifications and alterations without departing from the spirit and scope of the present invention. Therefore, the protecting range of the present invention falls in the appended claims.

What is claimed is:

1. An electrode structure of a memory capacitor, comprising:
    a lower electrode, consisting of an exterior annular pipe and a central pillar, the exterior annular pipe having an elliptic radial cross section, wherein a thickness along a short axis direction of the exterior annular pipe is larger than a thickness along a long axis direction perpendicular to the short axis direction of the exterior annular pipe;
a dielectric layer, covering the lower electrode; and
an upper electrode, covering the dielectric layer.

2. The electrode structure of the memory capacitor as claimed in claim 1, wherein an internal surface and an external surface of the exterior annular pipe is concave-convex.

3. The electrode structure of the memory capacitor as claimed in claim 2, wherein the internal surface and the external surface of the exterior annular pipe are undulated or square-wavy.

4. The electrode structure of the memory capacitor as claimed in claim 1, wherein an external surface of the central pillar is concave-convex.

5. The electrode structure of the memory capacitor as claimed in claim 4, wherein an external surface of the central pillar is undulated or square-waved.

6. The electrode structure of the memory capacitor as claimed in claim 1, wherein the lower electrode has a base electrode electrically connecting the exterior annular pipe and the central pillar.

7. The electrode structure of the memory capacitor as claimed in claim 1, adapted to a random access memory (RAM).

8. An electrode structure of a memory capacitor, comprising:
a lower electrode, having a plurality of first electrode materials and second electrode materials alternately stacked on top of each other, an internal surface and an external surface of the lower electrode being concave-convex, wherein the lower electrode consists of an exterior annular pipe and a central pillar formed by the first electrode materials and the second electrode materials, a radial cross section of the exterior annular pipe is elliptic, and a thickness along a short axis direction of the exterior annular pipe is larger than a thickness along a long axis direction perpendicular to the short axis direction of the exterior annular pipe;
a dielectric layer, covering the lower electrode; and
an upper electrode, covering the dielectric layer.

9. The electrode structure of the memory capacitor as claimed in claim 8, wherein the central pillar is a column or an elliptic pillar.

10. The electrode structure of the memory capacitor as claimed in claim 8, wherein the first electrode materials and the second electrode materials are electrode materials having different etching rates.

* * * * *